(12) United States Patent
Sagues et al.

(10) Patent No.: US 6,275,742 B1
(45) Date of Patent: Aug. 14, 2001

(54) WAFER ALIGNER SYSTEM

(75) Inventors: Paul Sagues, Ross; Stephen A. Gaudio, Berkeley; Tim K. Wong, Oakland, all of CA (US)

(73) Assignee: Berkeley Process Control, Inc., Richmond, CA (US)

( * ) Notice: Subject to any disclaimer, the term of this patent is extended or adjusted under 35 U.S.C. 154(b) by 0 days.

(21) Appl. No.: 09/293,664

(22) Filed: Apr. 16, 1999

(51) Int. Cl.[7] ........................................ G06F 7/00
(52) U.S. Cl. ............................ 700/213; 414/936
(58) Field of Search ........................ 700/213, 56, 57, 700/58, 59, 62; 414/936; 901/40, 44, 47; 324/765, 158.1, 758

(56) References Cited

U.S. PATENT DOCUMENTS

| | | |
|---|---|---|
| 3,972,424 | 8/1976 | Levy et al. . |
| 3,986,109 | 10/1976 | Poduje . |
| 4,158,171 | 6/1979 | Abbe et al. . |
| 4,457,664 | 7/1984 | Judell et al. . |
| 4,646,009 | 2/1987 | Mallory . |
| 4,692,695 | 9/1987 | Poduje . |
| 4,724,322 * | 2/1988 | Knowles et al. ................ 250/341 |
| 4,746,256 * | 5/1988 | Boyle et al. ..................... 414/217 |
| 4,752,898 * | 6/1988 | Koenig ............................. 364/559 |
| 4,770,600 | 9/1988 | Ishikawa . |
| 4,813,846 * | 3/1989 | Helms ............................. 414/744.1 |
| 4,819,167 | 4/1989 | Cheng et al. . |
| 4,846,626 | 7/1989 | Engelbrecht . |
| 4,860,229 | 8/1989 | Abbe et al. . |
| 4,880,348 | 11/1989 | Baker et al. . |
| 4,881,863 | 11/1989 | Braginsky . |
| 4,887,904 * | 12/1989 | Nakazato et al. ............... 356/375 |
| 4,892,455 | 1/1990 | Hine . |
| 4,895,486 | 1/1990 | Baker et al. . |
| 4,897,015 | 1/1990 | Abbe et al. . |
| 4,910,453 | 3/1990 | Abbe et al. . |
| 4,931,962 | 6/1990 | Palleiko . |
| 4,955,780 | 9/1990 | Shimane et al. . |
| 4,958,129 | 9/1990 | Poduje et al. . |
| 4,980,971 | 1/1991 | Bartschat et al. . |
| 5,030,057 | 7/1991 | Nishi et al. . |
| 5,054,991 * | 10/1991 | Kato ................................ 414/783 |
| 5,102,280 | 4/1992 | Poduje et al. . |
| 5,102,291 | 4/1992 | Hine . |
| 5,193,969 | 3/1993 | Rush et al. . |
| 5,194,743 * | 3/1993 | Aoyama et al. ................ 250/548 |
| 5,238,354 * | 8/1993 | Volovich ........................ 414/779 |
| 5,261,776 | 11/1993 | Burck et al. . |
| 5,265,170 | 11/1993 | Hine et al. . |
| 5,332,352 | 7/1994 | Poduje et al. . |
| 5,340,261 | 8/1994 | Oosawa et al. . |
| 5,365,672 * | 11/1994 | Kato ................................ 414/783 |
| 5,386,481 | 1/1995 | Hine et al. . |
| 5,405,230 | 4/1995 | Ono et al. . |

(List continued on next page.)

Primary Examiner—H. Grant Skaggs
Assistant Examiner—Khoi H. Tran
(74) Attorney, Agent, or Firm—David H. Jaffer; Pillsbury Winthrop LLP

(57) ABSTRACT

An alignment device for use with a robot for manipulating and aligning a series of semiconductor wafers with respect to an edge fiducial and the center of each wafer is disclosed. The device includes a rotary vacuum chuck for holding a wafer, and an edge detector comprising a light source that extends across the wafer edge as it moves and creates a shadow that falls on a charge coupled device (CCD) below. Output data from the CCD relative to the wafer edge position is processed by a programmable logic circuit and converted to quadrature data which is fed to the logic section of a controller. The controller is programmed to calculate the location of the wafer fiducial relative to the chuck axis and further to calculate the angular and distance offset of the wafer center from the longitudinal axis of the robot arm so that the robot arm can be moved to center the wafer with its fiducial at a preselected location before the wafer is removed from the rotary chuck.

11 Claims, 10 Drawing Sheets

U.S. PATENT DOCUMENTS

| | | | |
|---|---|---|---|
| 5,452,521 | * | 9/1995 | Niewmierzycki ............... 33/520 |
| 5,456,561 | | 10/1995 | Poduje et al. . |
| 5,466,945 | | 11/1995 | Brickell et al. . |
| 5,511,005 | * | 4/1996 | Abbe et al. ............... 364/552 |
| 5,513,948 | * | 5/1996 | Bacchi et al. ............... 414/783 |
| 5,520,501 | | 5/1996 | Kouno et al. . |
| 5,540,821 | | 7/1996 | Tepman . |
| 5,557,267 | | 9/1996 | Poduje et al. . |
| 5,563,798 | | 10/1996 | Berken et al. . |
| 5,564,889 | | 10/1996 | Araki . |
| 5,642,298 | | 6/1997 | Mallory et al. . |
| 5,655,871 | | 8/1997 | Ishii et al. . |
| 5,668,452 | | 9/1997 | Villarreal et al. . |
| 5,691,907 | | 11/1997 | Resler et al. . |
| 5,740,062 | | 4/1998 | Berken et al. . |
| 5,741,114 | | 4/1998 | Onodera . |
| 5,743,695 | | 4/1998 | Ryu . |
| 5,746,565 | | 5/1998 | Tepolt . |
| 5,818,632 | * | 10/1998 | Stephenson ............... 359/565 |
| 5,822,213 | * | 10/1998 | Huynh ............... 364/478.01 |
| 5,831,738 | | 11/1998 | Hine . |
| 5,851,102 | * | 12/1998 | Okawa et al. ............... 414/783 |
| 5,870,488 | * | 2/1999 | Rush et al. ............... 382/151 |
| 5,905,850 | * | 5/1999 | Kaveh ............... 395/94 |
| 5,943,130 | * | 8/1999 | Bonin et al. ............... 356/336 |
| 5,944,476 | * | 8/1999 | Bacchi et al. ............... 414/783 |
| 5,980,195 | * | 11/1999 | Miyashita ............... 414/783 |
| 5,990,650 | * | 11/1999 | Brock ............... 318/640 |
| 6,078,876 | * | 6/2000 | Rosenberg et al. ............... 702/152 |
| 6,085,125 | * | 7/2000 | Genov ............... 700/218 |
| B1 4,457,664 | | 8/1993 | Judell et al. . |

\* cited by examiner

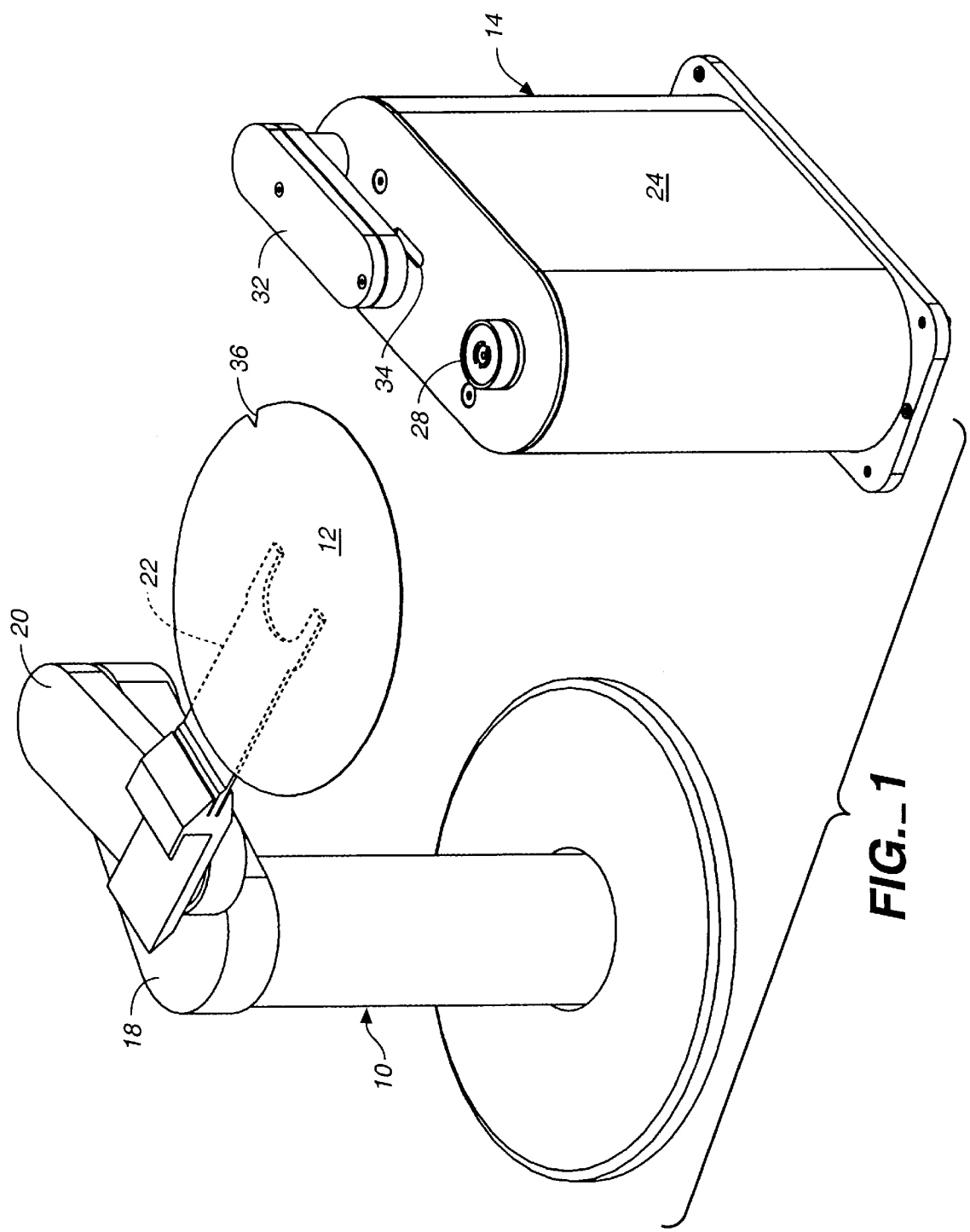
FIG._1

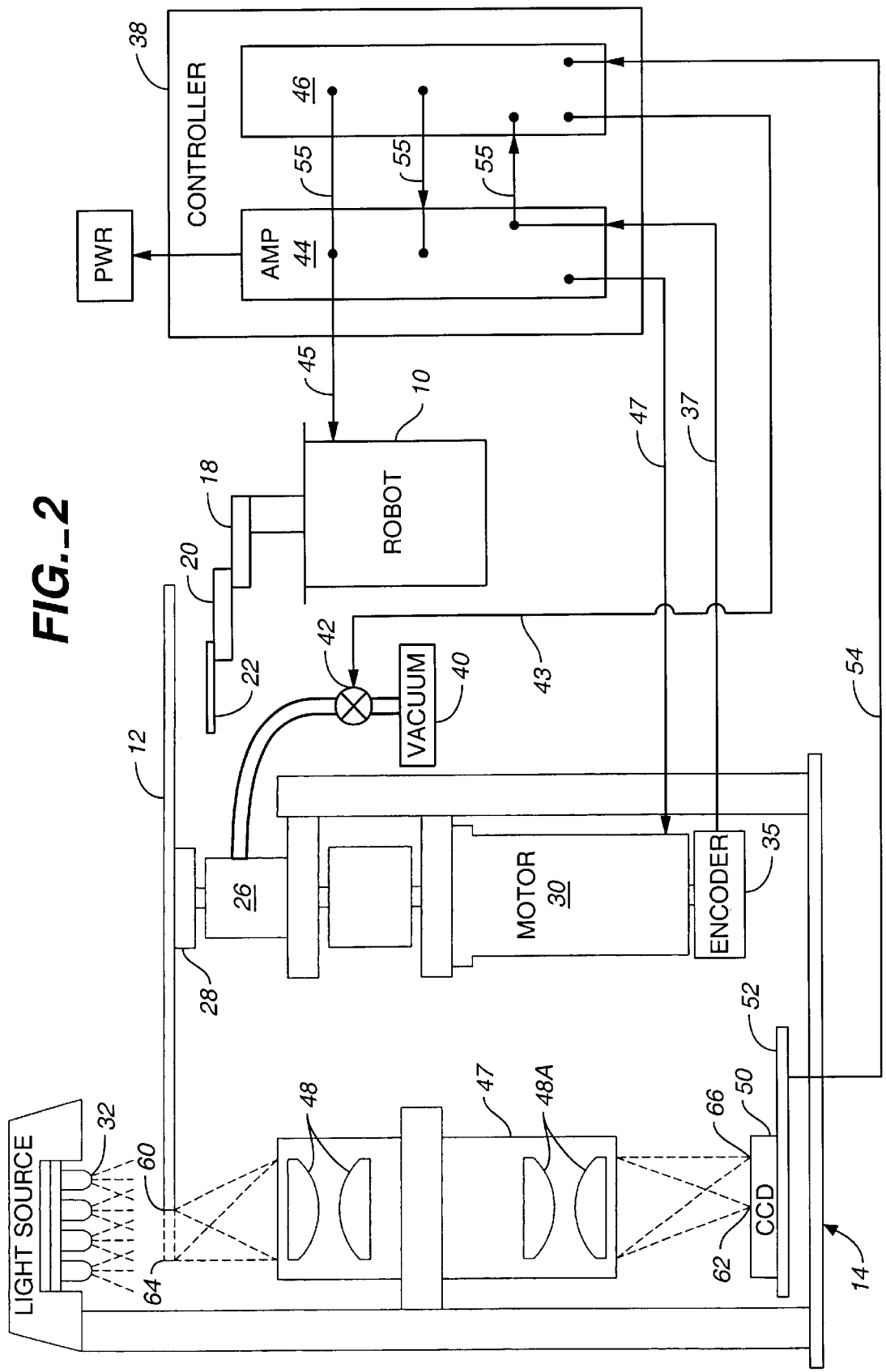

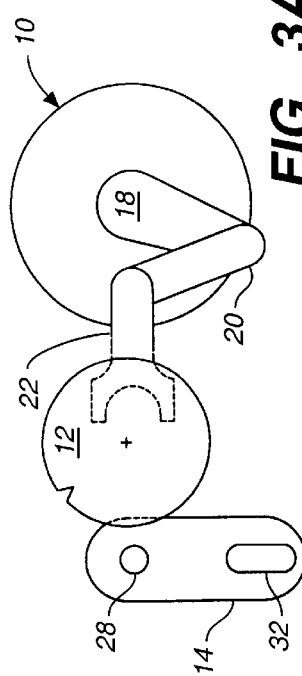
FIG._3A
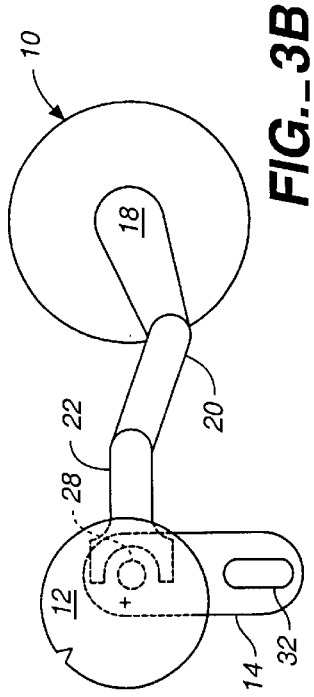
FIG._3B
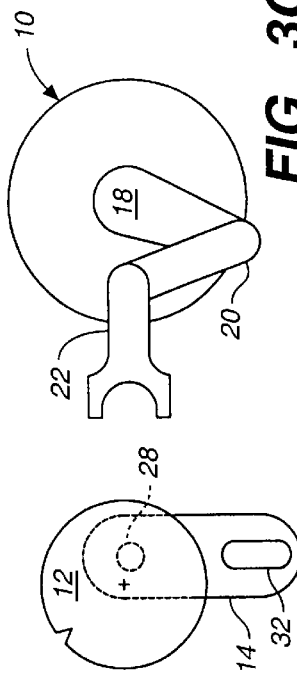
FIG._3C
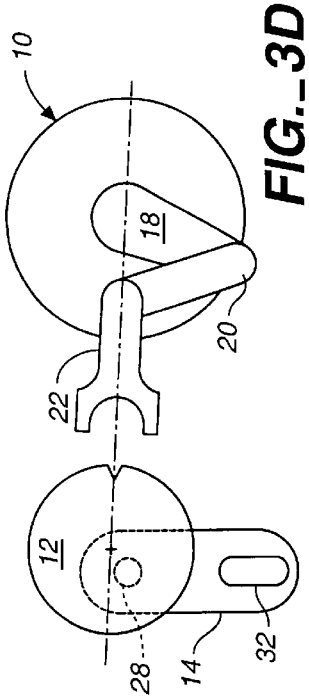
FIG._3D
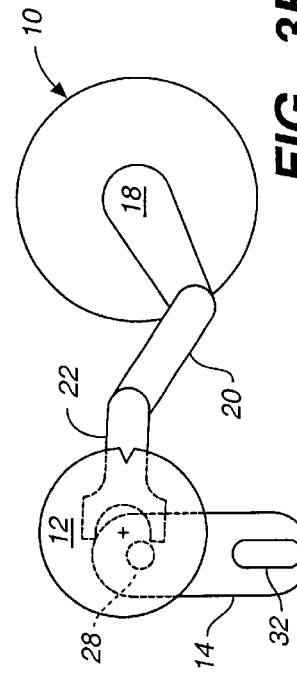
FIG._3E
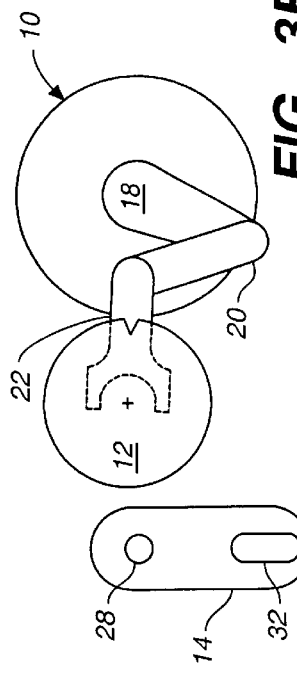
FIG._3F

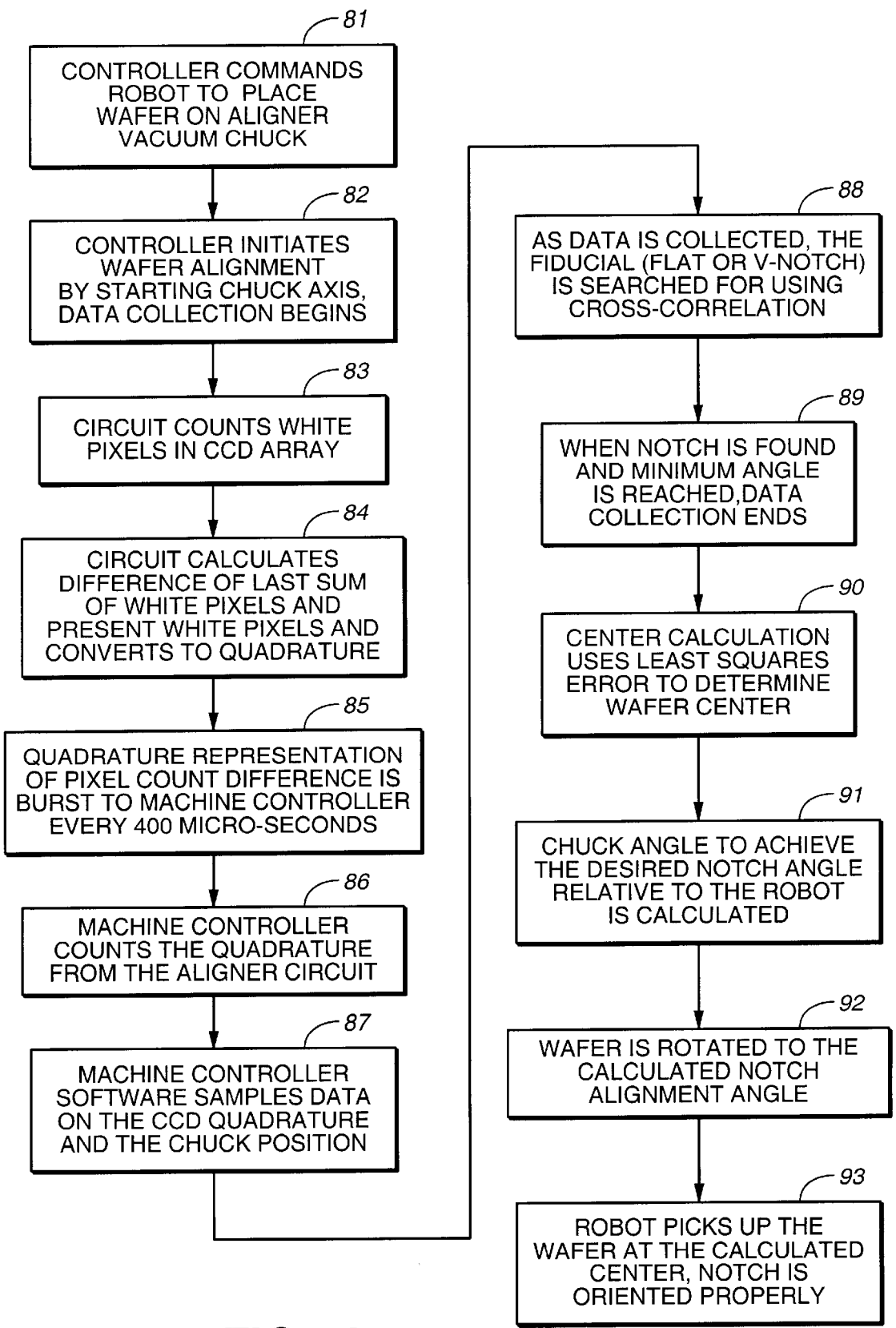
FIG._4

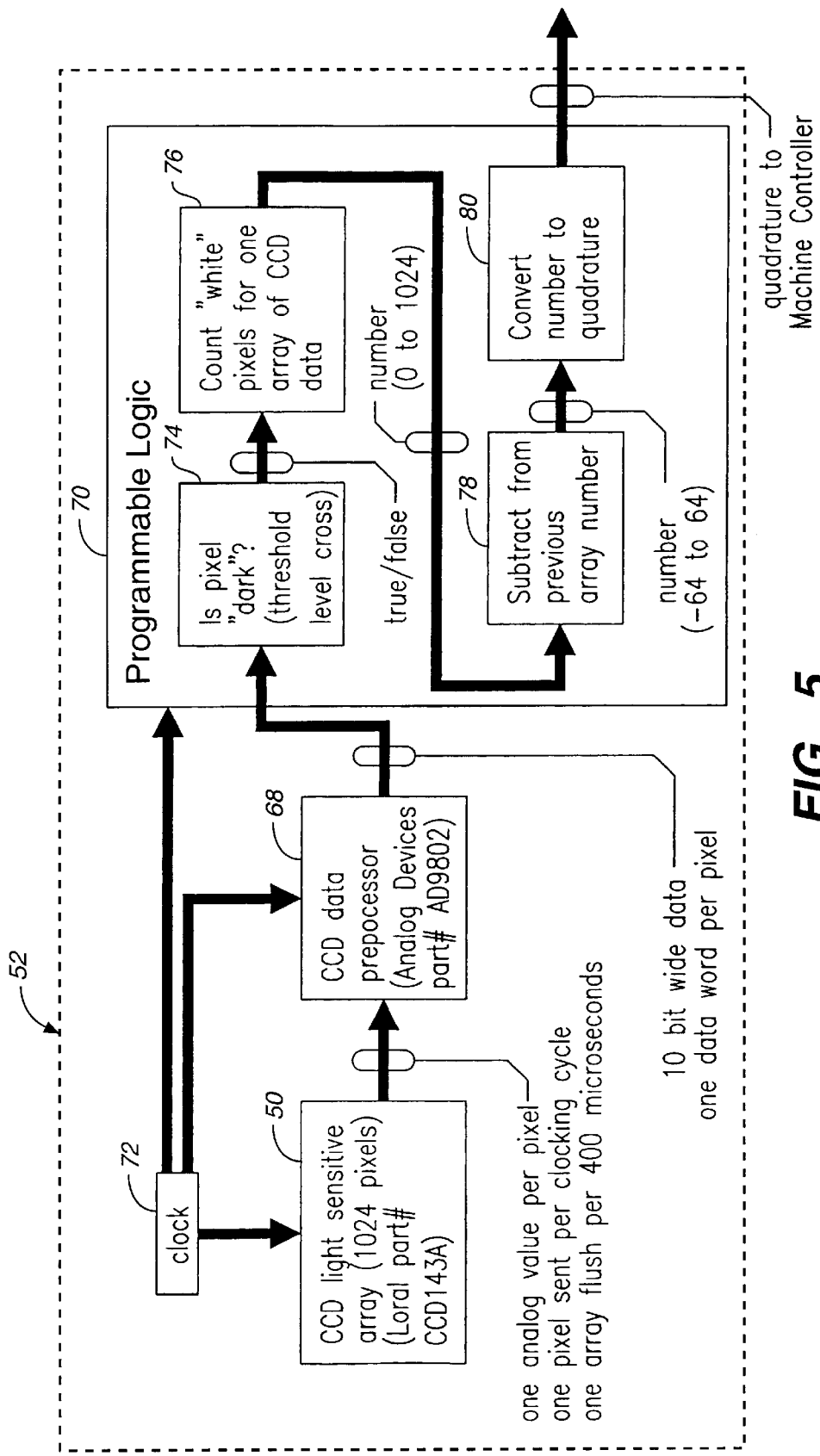
FIG._5

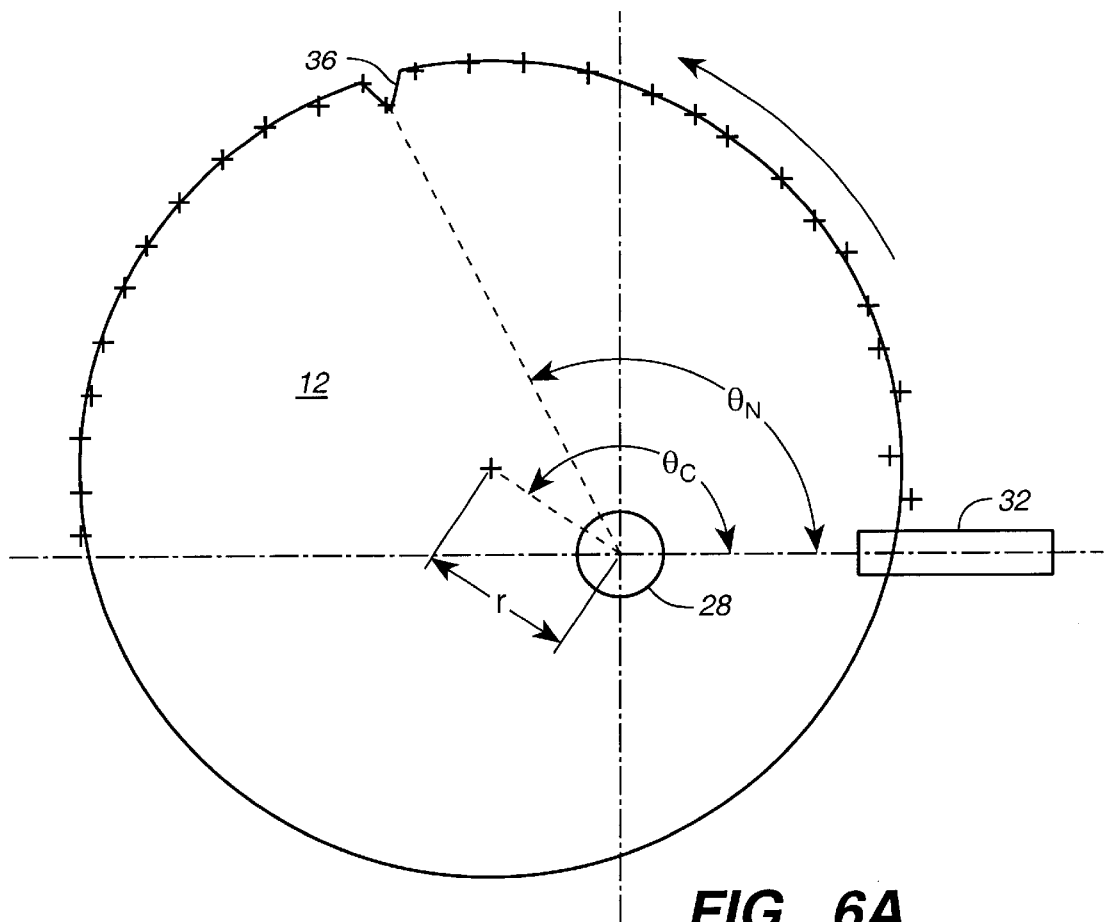
FIG._6A
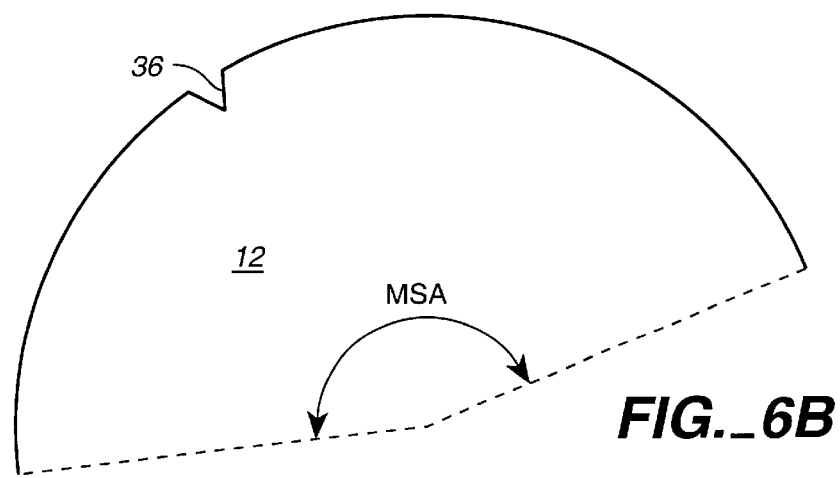
FIG._6B

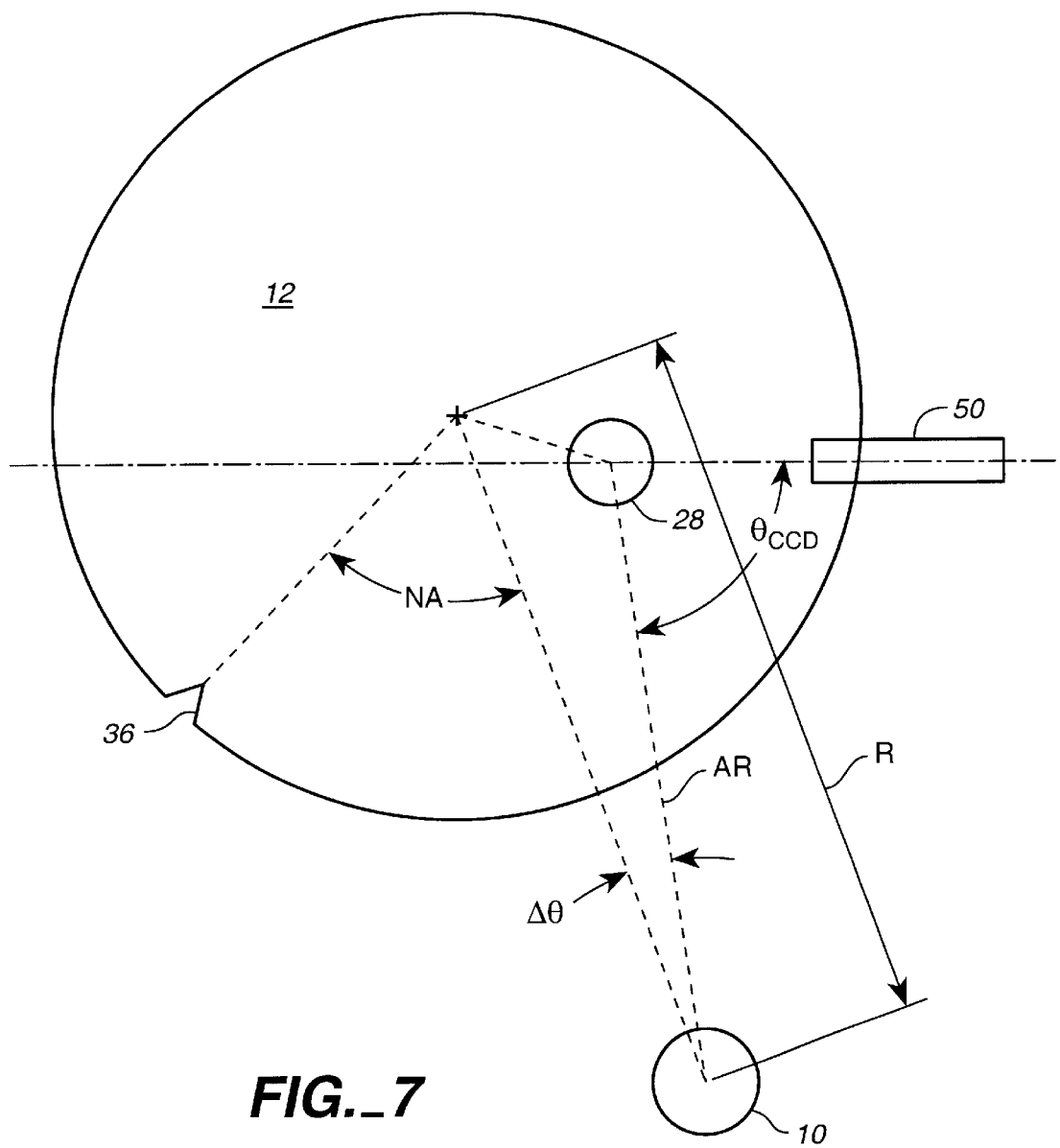
FIG._7

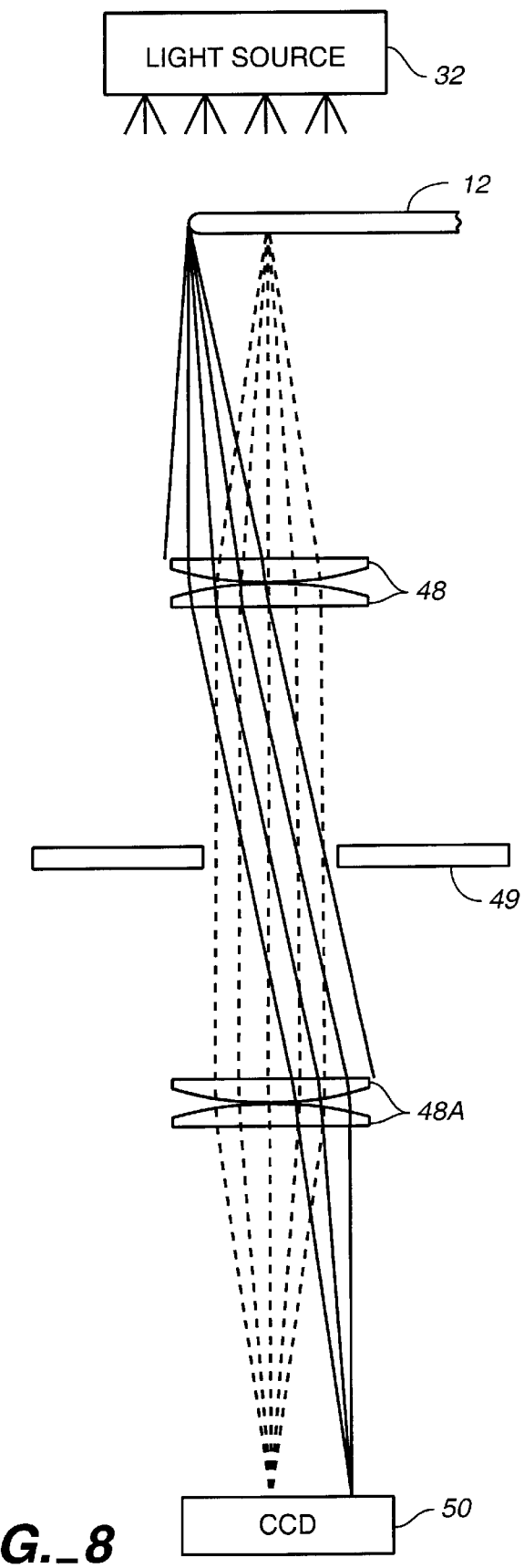
FIG._8

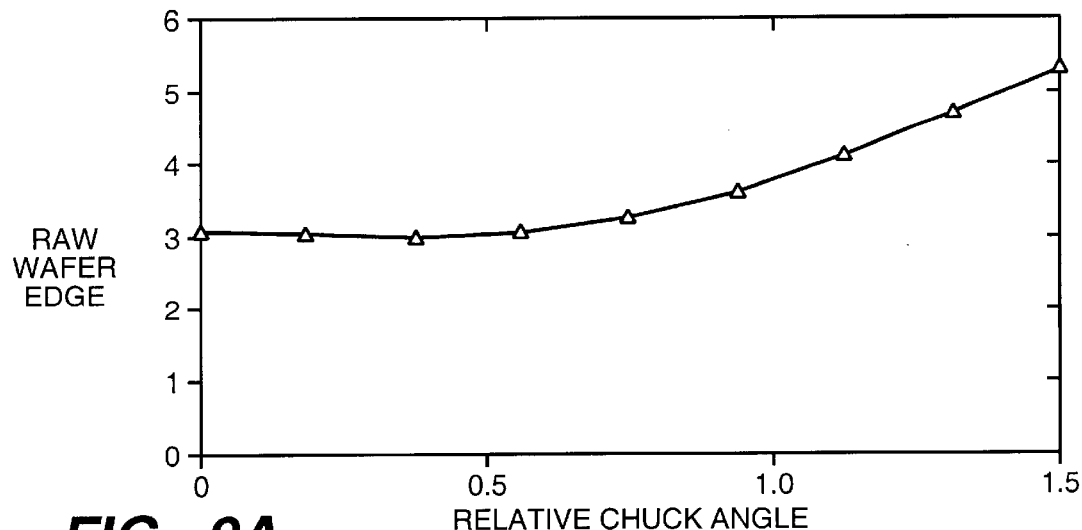
FIG._9A
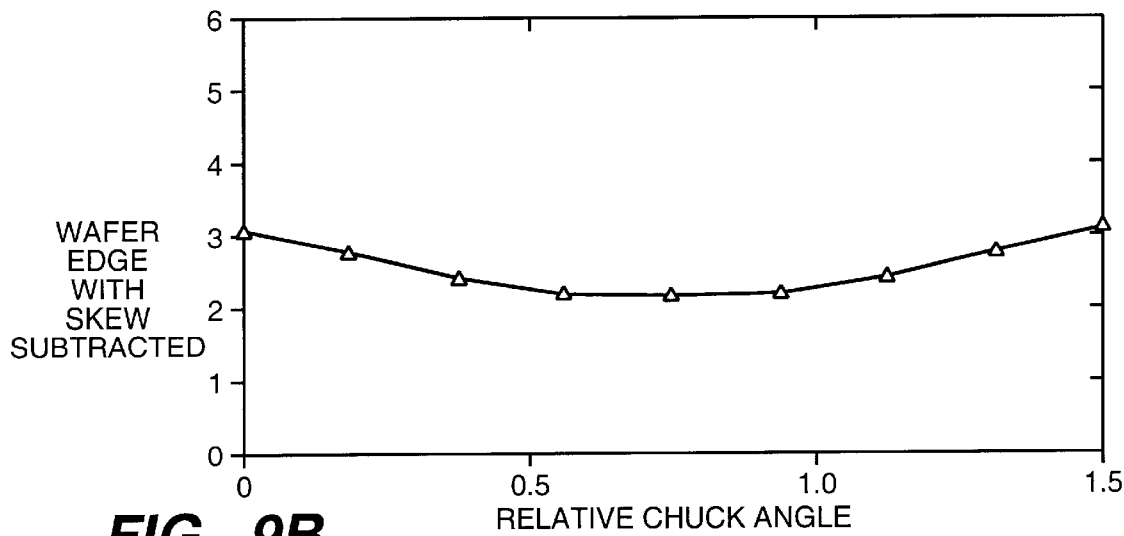
FIG._9B
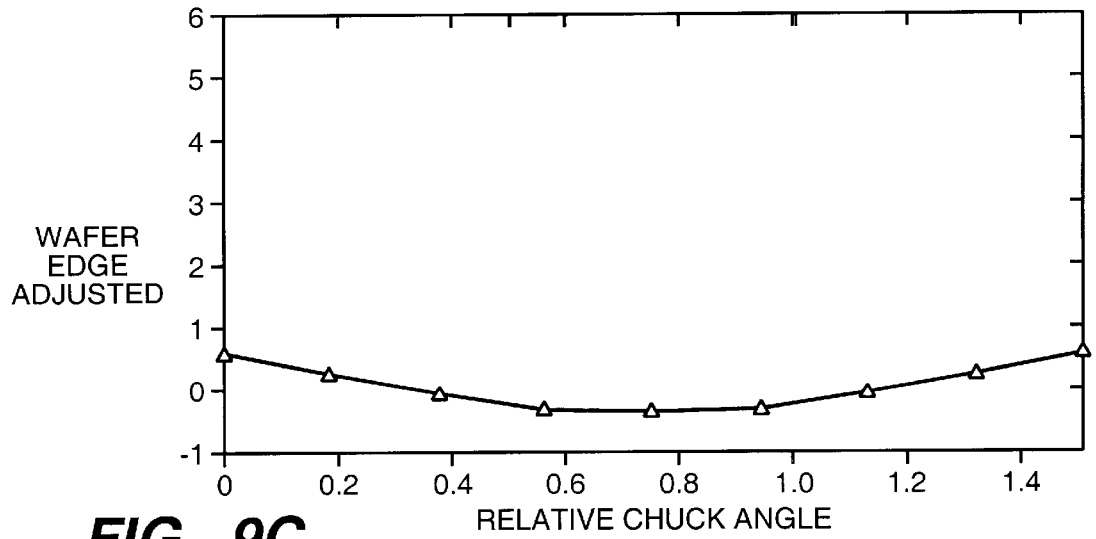
FIG._9C

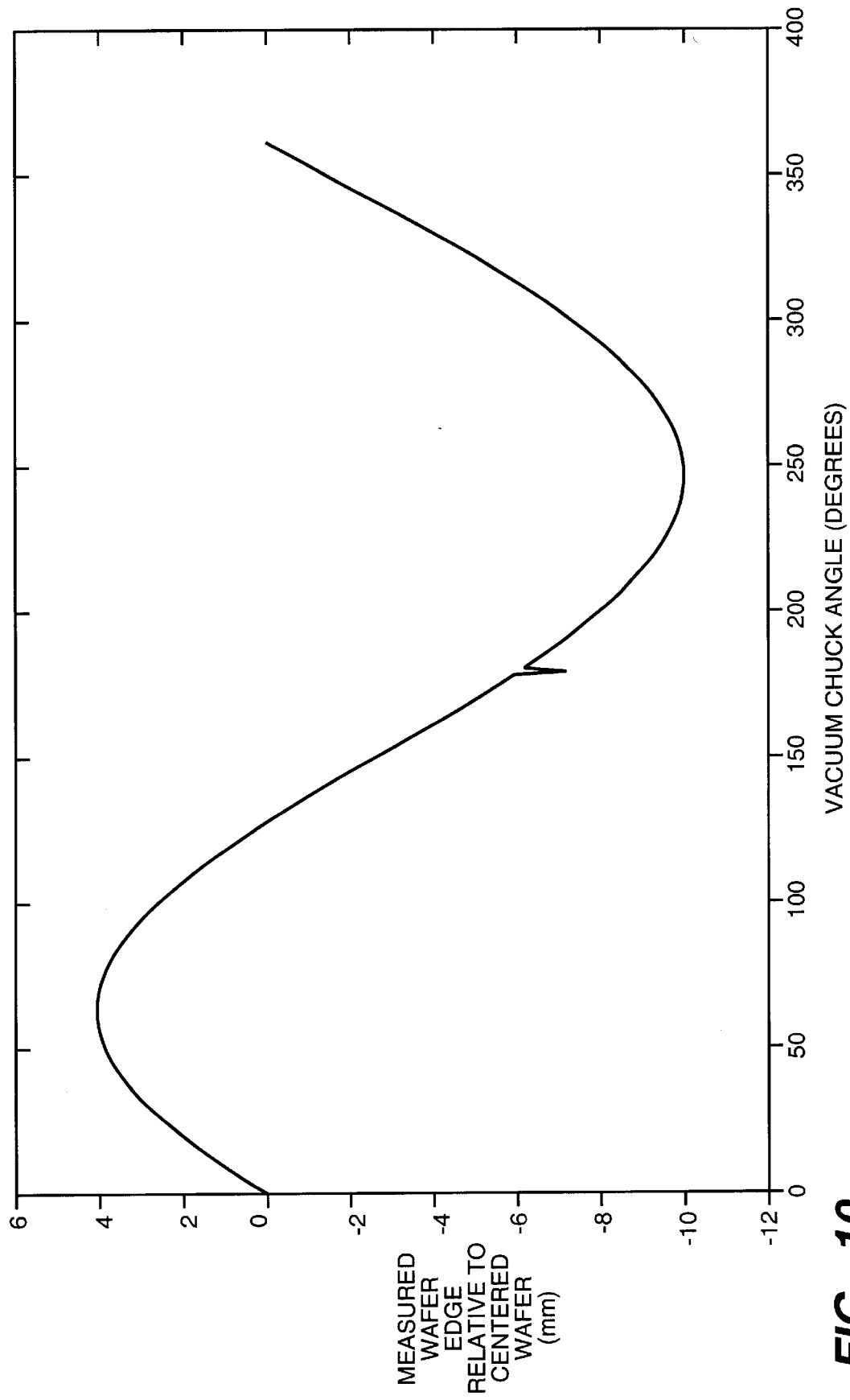
FIG._10

WAFER ALIGNER SYSTEM

FIELD AND BACKGROUND OF THE INVENTION

This invention relates to a system for automatically manipulating and aligning elements such as semiconductor wafers.

In many manufacturing, processing or sorting systems, controlled robots having articulated robot arms have been used to move elements such as semiconductor wafers from one processing or storage station to another. Such robots are movable in vertical (Z), horizontal (Θ) and radial (r) directions and their manipulation must be done repetitively at high speed and with maximum precision and reliability. Also, in semiconductor processing when one or a series of wafers are moved sequentially from station to station, they must be placed at each station in the same predetermined orientation or alignment with respect to both the center of the wafer and also a point of reference or fiducial on the edge of the wafer. Thus, each wafer has a distinguishing point of reference such as a notch or a flat spot on its peripheral edge, and at each station or storage cassette to which the wafers are moved to or from the notches and the centers of all wafers must be in precise alignment.

Various prior art aligner devices have been devised that attempt to solve this problem. One such device described in U.S. Pat. No. 5,102,280 utilizes a robot arm which is manipulated to lift a wafer that is on a vacuum chuck and move it laterally until it becomes centered on the vacuum chuck. Thereafter, the wafer is rotated until a predetermined position on the edge of the wafer is located by a sensor. The sensor controls the rotating chuck so that it stops with the retained wafer in a preselected Θ position. The robot arm is then required to move the wafer until it is centered on the chuck before it is removed therefrom. The present invention provides an improved robot apparatus and method for aligning wafers or elements with greater precision, speed and reliability.

BRIEF SUMMARY OF THE INVENTION

In accordance with the principles of the invention a robot connected to a controller having a servo amplifier is operable at an alignment station to place wafers consecutively on a vacuum chuck. When each wafer is placed on the chuck by the robot, its center may be offset from the center axis of the chuck and its edge fiducial may be randomly positioned. As each wafer is held by the vacuum chuck, it is rotated by a motor having an encoder which is also connected to the controller. Adjacent to the chuck is an alignment device having a backlight source which is positioned to extend radially across the wafer edge. The backlight source is directed downwardly through an optical relay lens system in the device to a light sensor array preferably comprised of charge coupled device (CCD). The CCD sensor output is connected on an electronic sensing circuit on a circuit board below the optical lens system and the latter is connected to the controller. The backlight source must be far enough away from the moving wafer edge to provide uniform background lighting from the point of view of the sensing electronics. The relay lens (magnification 1:1) projects the light falling onto the wafer edge from that wafer edge plane onto the CCD sensor. Thus, when the wafer edge moves relative to the backlight due to eccentricity or to a fiducial notch the image position of the wafer edge moves on the CCD sensor. Because of the lens systems, the image position is a sharp shadow that is cast upon the CCD with much greater power. The high power permits short exposure times which, in turn, enables faster data sampling, thereby allowing the wafer to be rotated at high speed. The sensing circuit for the CCD performs the function of converting the image of the edge of the wafer falling onto the CCD to quadrature position data which is fed to the controller logic. This allows the controller to track the position of the wafer edge as a position of an axis and enables high speed communication of edge position data. The CCD sensor is a line array oriented parallel to the viewing plane, and thus the image of the wafer edge falls nearly perpendicular to the axis of the array.

The data used to find the wafer notch and wafer center is preferably processed by a controller which utilizes velocity estimation and motor feedback collection as described in U.S. Pat. Nos. 4,639,884 and 5,062,064 assigned to the assignee of this invention. Since the data from the CCD sensor circuit is transmitted to the controller using standard motor quadrature, the CCD acts like a linear encoder to the controller in that it counts up when the CCD is obscured and maintains this value until the CCD is uncovered, after which the position counts back to where it started. Thus the sensor circuit data supplied to the controller is processed in the same manner as a normal axis in the controller hardware, but the software for this axis can be configured by the user to take data, search for the notch, and calculate the wafer center when the notch has been found. The vacuum chuck is controlled as a normal motor, and the control is not linked to the CCD feedback, although the two are synchronized during operation.

Other objects, advantages and features of the invention will become apparent from the following detailed description taken in conjunction with the accompanying drawing.

BRIEF DESCRIPTION OF THE DRAWING

FIG. 1 is a view in perspective of a robot arm and an alignment device according to the present invention.

FIG. 2 is a diagrammatic view of our alignment system embodying principles of the present invention.

FIGS. 3A–3F comprise a series of diagrammatic plan views showing operational steps of the alignment system according to the invention.

FIG. 4 is a flow diagram of operational steps for the alignment system of the present invention.

FIG. 5 is a block diagram illustrating steps for generating quadrature data according to the invention.

FIG. 6 is a diagrammatic plan view of a wafer on a rotary holder during a typical data acquisition procedure according to the invention.

FIG. 7 is a plan view of the wafer shown in FIG. 6 with critical data points and angles which are calculated and shown relative to a robot arm.

FIG. 8 illustrates typical data curves which are generated during an alignment procedure according to the invention.

FIGS. 9A–9C are typical data plots for determining wafer notch position according to the invention.

FIG. 10 is a typical plot of data output which indicates the wafer notch position relative to the vacuum chuck utilizing the method and apparatus of the present invention.

DETAILED DESCRIPTION OF EMBODIMENT

With reference to the drawing, FIG. 1 shows a robot 10 supporting a semiconductor wafer 12 and in the process of placing the wafer on an aligner device 14 embodying principles of the present invention. The wafer when in place on the device 14 is shown in phantom.

The robot 10 is of a type that is commercially available and has an articulated arm 16 having two connected segments 18 and 20 and an end effector 22 with spaced apart fingers with vacuum ports (not shown) for engaging and retaining the wafer during movement. The robot arm is controlled by three motors (not shown) which operate to move the arm in the vertical (Z), rotary horizontal (Θ) and radial (r) directions. Thus the robot 10 is controllable to first place the wafer on the aligner device 14 where the alignment procedure according to the invention is performed, and then to move the wafer to another processing station or to a storage device such as a cassette.

The aligner device 14 comprises a housing unit 24 that contains a rotary vacuum chuck 26 having an upper end member 28 that contacts the underside of the wafer. The chuck is rotated by a motor 30 (FIG. 2) within the housing. Supported above the housing is an elongated light source 32 which directs light rays through an opening 34 in the housing.

As shown, the wafer has a fiducial, shown as a notch 36, at a predetermined location on its edge. This fiducial, which may take other forms such as a flat spot on the wafer edge, provides the means for aligning each wafer in a desired orientation as it is moved to various processing stations. Also, when the wafer is initially moved to the alignment device, it may not be precisely centered on the vacuum chuck. As described below, the present invention provides a means for not only determining the location of the wafer notch 36 but also means for determining the precise center of the wafer so that when the robot is commanded to remove the wafer from the vacuum chuck for movement to another station, the wafer center will be located precisely on the centerline axis of the robot end member 22.

As will be apparent from the description below the wafer 12 when placed on the vacuum chuck 26 is caused to rotate by an amount sufficient to obtain alignment data which is normally less than one revolution. In response to the processed data the wafer is rotated to a computed alignment position and the robot end member is moved so that its axis is aligned with the center of the wafer. Thus, when the robot moves the wafer to the next station it is properly and precisely positioned.

General Arrangement

Turning to FIG. 2, the alignment system 10 is shown somewhat schematically, in greater detail. Both the robot 10, the aligner device 14 and the vacuum chuck motor 30 are electrically connected to a controller 38. An encoder 35 on the chuck motor 30 is connected by a multi conductor cable 37 to the controller 38. A vacuum source 40 is connected to the chuck 26 through a valve 42 which is controlled via a multi conductor cable 43 to the controller.

The controller 38 comprises a servo amplifier section 44 and a computer or logic section 46. The amplifier section provides power for driving the three robot motors via a multi-wire cable 45 and the vacuum chuck motor via a multi conductor cable 47. The logic section 46 processes data from system components as described below. Preferably, the controller is of the type that utilizes quadrature signals to process velocity signal data from encoders.

As shown, the light source 32 directs light rays downwardly through an optical system 47 comprised of a series of optical lenses 48 and 48A and onto an elongated CCD device 50. (The optical system will be described below in greater detail relative to FIG. 8.)

The CCD (Charge Coupled Device) chip 50 is a line array of light sensitive elements or pixels, e.g. 1024 pixels from end to end of the array. It is mounted on a circuit board having a programmable logic circuit 52 that processes the reaction of the pixels on the device 50 to light and shadow. The board 52 is connected by a multi conductor cable 54 to the logic section 46 of the controller 38.

The Optical System

The relay lens assembly comprising the optical system 47 is comprised of four identical plano-convex lenses, arranged as two spaced apart lens pairs 48 and 48A as shown in FIG. 8. Between these two lens pairs is fixed an aperture stop 49 which blocks out extraneous light. The lens material is acrylic but can be virtually any optical material since dispersion is not a design constraint in this specific application. The optic system is optimized to provide the following characteristics: (1) A large entrance pupil, or low f-number (f/#). The f-number of this design is effectively 1.82. The advantage of a large entrance pupil is to collect and focus a high amount of optical power onto the CCD sensor. Doing so permits shorter exposure times on the CCD (time between array samples) which in turn, permits high wafer rotation speeds and ultimately high system throughout; (2) A wide field of view which permits larger initial wafer eccentricity and thus fewer system-level errors due to wafer placement uncertainty; (3) Low vignetting which avoids optical power loss as the object reaches the extremity of the field of view; (4) Uniform spot size. The image of the wafer edge cast upon the CCD sensor 50 needs to be consistent throughout the total image field to avoid possible measurement error; (5) Low cost. Using four identical elements (as opposed to six differing elements in a standard double Gauss system) provides highly economical solution to the problem; (6) Low distortion. Compared to more elaborate optical systems, the distortion of the arrangement in FIG. 8 is fairly high but possesses sufficiently low distortion (about 0.25% at the maximum) to avoid introducing systematic measurement error; (7) Flat field of view. Since the wafer 12 and CCD sensor 50 both lie in very flat planes, this optical system 47 is optimized to project a flat image onto a flat plane; and (8) Fixed focus. The optical system possesses no adjustments for focusing. This simplifies design and speeds assembly.

The Controller to Aligner Interface

To the machine controller 38, the aligner device 14 looks like two basic items: A motor/encoder pair which is the vacuum chuck 26 and the CCD device 50 which looks like a linear motor encoder. Therefore the vacuum chuck 26 can be connected to the controller 38 as a normally powered axis and the CCD device 50 can be connected as a feedback only axis. The controlling hardware, which operates both the aligner device and the wafer handling robot 10, consists of the controller 38 and its servo amplifier 44. The motors in the robot as well as the aligner vacuum chuck 26 are preferably connected to the amplifier with a cable containing both encoder feedback in addition to motor power. Within the controller, the amplifier is connected to the logic section with cables 55 containing the encoder feedback and the motor control signal. The CCD signal can be connected directly to the controller or it can be fed through the amplifier, and it contains only encoder feedback type signal. The CCD signal is read as quadrature by the controller and is used as position data with respect to the vacuum chuck for all calculations.

General Operation

When a wafer 12 is moved by the robot, it is placed on the vacuum chuck holder 28 so that the wafer edge falls between the backlight source 32 and the relay lens 47. The backlight source must be far enough away from the wafer edge to provide uniform background lighting from the point of view of the sensing electronics. The relay lens (magnification 1:1) projects the light falling onto the wafer edge plane from that wafer edge plane onto the CCD sensor 50, as shown in FIG. 2. The edge of the wafer at position 60 is projected to an image at position 62 on the sensor 50, and likewise for positions 64 and 66 respectively. Thus, a sharp image is cast upon the CCD sensor 50 with much greater intensity than without having a lens. The high power permits short exposure times, which in turn, permits faster data sampling, thereby allowing the wafer to be rotated at relatively high speed (e.g. 2 revs per sec).

The shadow cast onto the CCD sensor array produces a single number which represents the location of the shadow edge on the array. The CCD cells (pixels) that are under the shadow of the wafer report a "0" or "no light", while the CCD cells that are not under the shadow and thus exposed to the light support a "1" or light. Thus, the circuitry in the board 52 performs the function of determining the edge of the shadow and producing a digital word representing its radial position by converting the image of the edge of the wafer falling onto the CCD sensor 50 to quadrature position data. With this quadrature data the controller 38 tracks the position of the wafer's edge as a position of an axis and allows high speed communication of edge position data.

The Sensor Circuit Board

The block diagram of FIG. 5 illustrates how the quadrature position data is generated. The CCD sensor 50, which is a light sensitive array of 1024 pixels (e.g. Loral part #CCD 143A) is connected to a CCD data preprocessor 68 (e.g. Analog Devices part #AD9802) which in turn is connected to a programmable logic circuit 70. All three of these components (50, 68 and 70) are connected to a single voltage supply (not shown) that furnishes all the necessary power levels, bias voltages and clock signals required to operate each individual component. As the wafer 12 is rotated on the vacuum chuck, the eccentricity of the wafer causes its edge to move back or forth along the elongated backlight and thus producing a resultant movement of a shadow on the CCD sensor. The CCD sensor 50 outputs analog data serially per clock cycle of each pixel exposure in sequence (interleaved with clock feedthrough noise and prefaced with reference pixel data).

The programmable logic circuit 70 supplies the CCD chip 50 with various clocking signals from a clock 72 such that the array data (1024 pixels) is flushed out of the chip serially and is presented to a single output pin serially. This process is repeated once per sample which occurs about every 500 micro-seconds as the wafer rotates. The CCD sensor prefaces and appends the pixel data with various reference "dark" and "white" signals. The CCD processor 68 accepts preface reference data and, in conjunction with feedback from the programmable logic 70, adjusts and sets internal sensitivity gain to automatically normalize the white reference pixel data. Therefore, the actual sensed data will be normalized at a fixed gain per data set. The CCD processor 50 converts the actual sensing pixel data into a digital number, scaled according to the gain which was automatically adjusted according to the preface white reference signal. The programmable logic circuit accepts the digital number produced by the CCD processor and determines, by means of a logic circuit 74, whether or not a particular data associated with a pixel is inside or outside the image of the wafer shadow cast upon the CCD sensor array (ie, performs a 1-bit ADC on pixel data where "1" is white (outside the wafer edge) and "0" is dark (underneath the wafer shadow)). The logic element 76 of the programmable logic circuit 70 counts the number of pixels which fall outside the wafer shadow (pixels considered "white"). Immediately after a complete data set is processed (1024 pixels) the number of white pixels counted is subtracted by an element 78 from the number of white pixels counted in the previous data set. This produces a positive or negative digital number which is then converted by element 80 into an incremental quadrature data burst, which is transmitted to the machine controller via standard 422 communication connection. The machine controller decodes the quadrature information thus interpreting the wafer edge position as a position of a non-powered axis.

Data Collection

In accordance with the invention data collection on the controller 38 normally performed robot for motor control is also utilized for the aligner functions. When a command to align a wafer is issued, the wafer is rotated and every 500 micro-seconds an interrupt function runs to collect data. FIG. 6A shows diagrammatically how the data is collected with the "+" symbols representing data points collected. (The actual frequency of points is much greater.) The controller stores the CCD wafer edge position as well as the vacuum chuck positions if the present vacuum chuck angle is greater than a predefined data collection increment. This data collection increment is determined by the vacuum chuck encoder resolution. For example, a 10,000 count encoder would allow an increment of 0.036 degrees. This method of data acquisition is independent of time, velocity, and acceleration, creating a similar data set for any vacuum chuck velocity profile. Basing the data collection on the vacuum chuck position also prevents the collection of unnecessarily large and redundant data. The symbol $\Theta_N$ in FIG. 6A represents the notch angle relative to the chuck center and the sensor; $\Theta_C$ is the angle of the wafer center relative to a start position from the server; and "r" is the radial offset relative to the chuck center. In FIG. 6B, the angle "MSA" represents the minimum sweep used to find the wafer center.

Wafer Fiducial Detection

While the data is being collected and the vacuum chuck is spinning, the controller is programmed to search through previously collected data for the wafer fiducial (V-Notch or Flat edge). The fiducial angle is determined as follows:

1—A notch search begins after the vacuum chuck has rotated one notch width while collecting and storing CCD sensor data.

2—One notch width worth of previously scanned data is compared to a known given notch geometry, thereby determining a start and end index for a potential notch. A typical plot of such raw data is shown in FIG. 9A.

3—A first step in normalization is made by subtracting out the skew in the notch data caused by the eccentricity of the wafer spinning on the vacuum chuck. This is done by fitting a line to the data and subtracting the line from the data set, effectively rotating the sloped data to flat (See FIG. 9B).

4—Next the average of the rotated data is subtracted out, centering the curve about zero (See FIG. 9C).

After the aforesaid normalization is performed, the cross-correlation of the ideal notch and the potential notch is then calculated by the controller 38. The cross-correlation is calculated by summing the product of each CCD value in the notch data (See FIG. 9C) and the corresponding point in the ideal notch curve. A lookup table for the ideal notch curve is created off-line, and the index into the table is calculated using the vacuum chuck angle related to CCD value being processed. The cross-correlation sum is normalized by dividing it by the number of data points in the notch. This allows the cross-correlation for different sized notch data sets to be compared against one threshold.

To determine when the fiducial has been found, a cross-correlation threshold is used. When the cross-correlation value drops back below the threshold, the fiducial is marked as found and the notch search stops. The location of the cross-correlation peak value is the location of the wafer fiducial. The symbol $\Theta_N$ in FIG. 6A represents the notch angle relative to the chuck center or determined by the cross-correlation calculation. To prevent finding a false fiducial when the alignment begins with the fiducial in the CCD window, the cross-correlation value must drop below the threshold before the peak search begins.

The flat fiducial is found using the same method as the V-notch, except the in process calculation is performed using a data set which is collected in 1.75 degree increments. The accurate data is also collected, but is not used until the notch is found within 1.75 degrees. This prevents time consuming cross-correlation calculations from running for each point in the accurate data set. After the flat edge is found using the large increments, the same data used to find the V-notch is analyzed +/−1.75 degrees from the coarsely found notch to accurately determine the flat edge position. FIG. 10 shows a typical plot of data derived by the aforesaid method wherein the measured wafer edge of an off-center wafer with a notch is shown for varying degrees of chuck angle. The spike in the curve readily shows the angular location of the wafer notch.

Wafer Center Determination

Once the notch has been found the center calculation begins. This calculation is performed by the controller as follows:

First, the data in the fiducial is subtracted from the center find data set. To do this, the data is scanned one half of a fiducial width in both directions from the fiducial position. If the upper or lower fiducial limits are outside the bounds of the data set, the notch zone is wrapped around to the other end of the data set. The data in this fiducial region is not used for center calculation.

Next the points to perform the center calculation are selected from the data set. The number of points to use is configured by the user. These points will be used to calculate the center.

The data set is then put into the solution to a least squares error fit to an off center circle. This solution gives the center position of the wafer relative to the vacuum chuck. As shown in FIG. 7, "$\Theta$" is the angular offset of the wafer center from the center of the vacuum chuck; "R" is the radial position of the wafer center relative to the robot's vertical axis of rotation; and NA is the user defined notch angle relative to the robot. The controller software calculates the position of the wafer center relative to the robot for a desired fiducial angle (NA) as well as for a given vacuum chuck angle. The values $\Delta \Theta$ and R are then calculated to define the wafer center relative to the robot axis. With these values computed, the controller can be programmed to cause the robot arm to move so as to pick the wafer 36 up on center, with the fiducial 36 aligned as desired. The aforesaid parameters with respect to the aligner and the robot are calculated by the controller using known trigonometric formulae relating r and $\Theta_C$ (FIG. 6A), AR and $\Theta_{CCD}$ (FIG. 7) to NA, R and $\Delta \Theta$ (FIG. 7).

The operation and method steps of the alignment procedure according to the present invention may be summarized by reference to FIG. 4 in conjunction with FIGS. 3A–3F.

In FIG. 3A, the wafer 12 to be aligned is shown on the end effector 22 of the robot 10 with the center of the wafer typically offset from the longitudinal axis of the robot end effector and the wafer notch at some random position. In the first block 81 of FIG. 4, the controller commands the robot to place the wafer on the vacuum chuck (FIG. 3B). In FIG. 3C, the robot is retracted and in block 82, the controller initiates the wafer alignment by starting chuck rotation and data collection.

As shown in FIG. 6A, data is collected at every 500 micro-second interval, (indicated by the plus signs along the edge of the wafer). An interrupt function runs to store the CCD sensor position as well as the vacuum chuck position at every interval.

During the data collection process (block 83) the circuit 52 counts the white pixels in the CCD array for each data interval. The circuit then calculates the difference between the last sum of white pixels and the present white pixels and converts the result to quadrature (block 84). The quadrature representation of the pixel count difference (which is an indication of the wafer edge position) is sent in a data burst to the controller logic section every 400 micro-seconds (block 85). The controller counts the quadrature signals from the aligner circuit (block 86) and then samples data on the CCD quadrature together with the chuck position (block 87). As data is collected, the fiducial (Flat or V-notch) is searched for by the controller logic section using a cross-correlation procedure (block 88) previously described. When the notch is found and minimum angle is reached, data collection ends. (block 89) The controller performs a center calculation using a least squares error method to determine the wafer center (block 90). The chuck angle to achieve the desired notch angle relative to the robot is calculated (block 91) as described. Now, the wafer is rotated by the chuck to the calculated notch alignment angle (block 92), as shown in FIG. 3D.

The robot arm is moved to the proper pickup position as shown in FIG. 3E. The robot is positioned by the controller so that the wafer center is on the longitudinal center axis of the robot end extender 22. The robot then picks up the wafer at the calculated center, with the notch oriented properly (block 93), and the robot retrieves the wafer, as shown in FIG. 3F.

An important feature of the present invention is that the digital value representing the radial location of the shadow produced by the CCD array 50 is continuously converted into an incremental signal in quadrature as is the signal produced by the encoder feedback signal from the motor rotating the wafer. These conversions are made at about 10,000 times per second or every 100 micro-seconds (0.0001 second) and the incremental signal in quadrature can be updated more than 1,000,000 times per second (0.000001 second). Thus, under the present invention, only two signals, wafer angle and the radial CCD shadow location are presented to the motion controller using signals in quadrature. By employing this feature no custom hardware must be constructed, and the two channels of data are precisely synchronized using the commercial motion controller 38 which employs the method and apparatus of the U.S. Patents referenced above.

To those skilled in the art to which this invention relates, many changes in construction and widely differing embodiments and applications of the invention will make themselves known without departing from the spirit and scope of the invention. The disclosure and the description herein are purely illustrative and are not intended to be in any sense limiting.

What is claimed is:

1. In a system for manipulating a series of disk like elements so that each element can be transported separately by a robot having an articulated two leg arm and an end effector to a station in a precise, predetermined orientation and alignment with respect to a reference fiducial on the element edge and the geometric center of the element, said system comprising:

(a) a machine controller;

(b) a rotary vacuum chuck for supporting an element and having a motor for driving said chuck connected to said controller;

(c) an alignment device including an elongated light source which is above and extends across the outer edge of said element held on said chuck so as to produce a shadow image of an edge of said element;

(d) an elongated sensor means located below said light source and the outer edge of said element and positioned to receive said shadow image;

(e) means for processing the output from said sensor means to produce quadrature signal data relative to the actual position of the edge of said element;

(f) means in said controller for synchronizing quadrature signals from said chuck motor and said sensor means for determining the location of said fiducial on said element and its geometric center relative to said chuck; and (g) optical means between said light source and said sensor means for optimizing the demarcation between light and shadow on said sensor means, wherein said optical means comprises first and second pairs of plano-convex lens which are spaced apart between said light source and said sensor means.

2. The system of claim 1 wherein said sensor means comprises a charge coupled device having a plurality of pixels which provide an output when exposed to light.

3. The system of claim 2 wherein the output from said sensor means provides a digital "1" for pixels exposed to light and a digital "0" for pixels within the shadow area and not exposed to light.

4. The system of claim 1 wherein said optical means further comprises a light stop between said first and second lens pairs for providing an aperture for light rays between lens pairs while eliminating extraneous ambient light.

5. The system of claim 1 wherein said means for processing the output from said sensor means comprises: a data processor means; a clocking means for establishing data cycles; and programmable logic means for counting the number of pixels exposed to light in a cycle; subtracting the number of said pixels from the number of pixels exposed to light in a previous cycle to provide a net number; and converting the net number to quadrature signals for said controller.

6. The system of claim 1 wherein said machine controller comprises a logic section and an amplifier section for controlling three axis motors for said robot and also said rotary chuck motor.

7. The system of claim 1 wherein the arm of said robot is movable by said controller in the (r) radial direction, the ($\ominus$) horizontal direction and the (z) vertical direction, and said end effector has finger portions equally spaced from opposite sides of its longitudinal centerline.

8. The system described in claim 1 wherein said disk like element is a semiconductor wafer.

9. The system described in claim 8 wherein said controller includes means for rotating the wafer by said vacuum chuck so that said fiducial is at a predetermined location thereon before the wafer is removed from the chuck by a robot end effector.

10. The system described in claim 1 wherein said controller includes means for computing an offset angle relative to the robot vertical axis from the center of said wafer to the center of said vacuum chuck; and means for controlling the $\ominus$ axis motor of said robot to move said robot arm by the amount of said offset angle so that said wafer will be precisely centered on an end effector when the robot removes the wafer from the vacuum chuck.

11. A method for determining the position of a fiducial on the edge of a circular wafer retained on a rotary chuck with respect to the rotary axis of the chuck comprising the steps of:

(a) rotating the wafer by said chuck;

(b) tracking the position of the wafer's edge as the wafer is rotated to produce wafer edge position data points at time intervals;

(c) converting the edge position data to quadrature position data and furnishing it to a controller;

(d) processing the edge position data in the controller using a cross correlation procedure in conjunction with an ideal fiducial curve to provide the precise position of the fiducial with respect to the chuck axis, wherein said fiducial is a notch and the controller processing steps include:

(i) comparing one notch width of scanned data with a known given ideal notch geometry;

(ii) providing a cross-correlation of the ideal notch with the acquired notch position data by summing the product of each data point and a corresponding point in an ideal notch curve;

(iii) providing a lookup table for the ideal notch curve;

(iv) calculating an index into said table using the angle of said chuck axis for each data point;

(v) establishing a cross-correlation threshold; and (vi) marking the location of the notch when the cross-correlation value falls below the threshold.

* * * * *